United States Patent

Yazu et al.

[11] Patent Number: 4,699,687
[45] Date of Patent: Oct. 13, 1987

[54] METHOD OF SYNTHESIZING CUBIC SYSTEM BORON NITRIDE

[75] Inventors: Shuji Yazu; Hitoshi Sumiya; Junji Degawa, all of Itami, Japan

[73] Assignee: Sumitomo Electric Industries, Ltd., Osaka, Japan

[21] Appl. No.: 909,263

[22] Filed: Sep. 19, 1986

[30] Foreign Application Priority Data

Sep. 24, 1985 [JP] Japan ............................ 60-211848
Jun. 17, 1986 [JP] Japan ............................ 61-142256

[51] Int. Cl.[4] ............................................ C30B 29/38
[52] U.S. Cl. ........................ 156/603; 156/DIG. 86; 156/DIG. 99; 423/210
[58] Field of Search .............. 156/603, 607, 621, 622, 156/623 R, DIG. 86, DIG. 99; 423/290; 23/301

[56] References Cited

U.S. PATENT DOCUMENTS

| | | | |
|---|---|---|---|
| 3,701,826 | 10/1972 | DeVries et al. | 156/DIG. 86 |
| 4,167,436 | 9/1979 | Rodot et al. | 156/607 |
| 4,373,988 | 2/1983 | Bauser et al. | 156/622 |
| 4,409,193 | 10/1983 | Sato et al. | 423/290 |
| 4,469,802 | 9/1984 | Endo et al. | 423/290 |
| 4,551,195 | 11/1985 | Iizuka et al. | 423/290 |
| 4,562,163 | 12/1985 | Endo et al. | 423/290 |

FOREIGN PATENT DOCUMENTS 38165 9/1984 Japan.
60-131811 7/1985 Japan.

OTHER PUBLICATIONS

Article entitled: Phase Equilibria Pertinent to the Growth of Boron Nitride; by R. C. De Vries and J. F. Fleischer; Journal of Crystal Growth; 13/14 (1972), 88-92; published by North-Holland Publishing Co.

Primary Examiner—John Doll
Assistant Examiner—R. Bruce Breneman
Attorney, Agent, or Firm—W. G. Fasse; D. H. Kane, Jr.

[57] ABSTRACT

Cubic system boron nitride crystals are synthesized by using a synthesizing vessel separated into a plurality of synthesizing chambers by one or more partition layers. After preparing the synthesizing vessel it is heated under extra-high pressure to achieve a required temperature gradient from chamber to chamber. A plurality of solvents having different eutectic temperatures with respect to boron nitride (BN) sources are placed in the chambers according to the temperature gradient. The BN sources are placed in contact with solvent portions heated to relatively high temperatures. At least one seed crystal is placed in each solvent portion heated to relatively low temperatures. At least one cubic system boron nitride crystal is grown in each of the solvents in the chambers by the above heating of the synthesizing vessel under conditions of ultra-high pressure and temperatures assuring the required temperature gradient.

8 Claims, 7 Drawing Figures

METHOD OF SYNTHESIZING CUBIC SYSTEM BORON NITRIDE

FIELD OF THE INVENTION

The present invention relates to a method of synthesizing crystals of cubic system boron nitride (referred to hereinafter as cBN). Particularly, it relates to a method of synthesizing a large number of crystals of cBN at a time by using a synthesizing vessel divided into a plurality of chambers.

DESCRIPTION OF THE PRIOR ART

There are generally two methods of synthesizing cBN. According to a first method, hexagonal system boron nitride (referred to hereinafter as hBN) is used as the starting raw material which is mixed with or brought into contact with a solvent such as an alkaline metal, an alkaline earth metal, or a nitride thereof or a boronitride thereof to be subjected to an ultra-high pressure and a high temperature where cBN is stable whereby hBN is converted to cBN under the action of the solvent.

According to this first method, the solvent penetrates into the starting raw material hBN, whereby boron nitride (referred to hereinafter as BN) is diffused through the solvent in the form of a thin film to generate cBN. The driving force for the generation of cBN in this first method is the difference between the solubility of hBN and the solubility of cBN with respect to the solvent under a constant temperature. In this first method, cBN is spontaneously nucleated and is rapidly grown until it reaches a certain size. A large quantity of fine powder of cBN is synthesized by this first method. However, crystals having a larger size and good quality cannot be synthesized by the above described first method.

A second method for synthesizing crystals of cBN is described for example in Japanese Patent Laying-Open Gazette No. 156399/1982, in which large-sized crystals of cBN of high quality can be synthesized. This method utilizes a synthesizing vessel as shown in FIG. 2. Referring to FIG. 2, a seed crystal 1 is placed in a portion near the lower end of the synthesizing vessel surrounded by molybdenum plates 5. A BN source 2 is provided in a central portion along the axial direction of the synthesizing vessel and a solvent 3 is placed under the BN source 2. The portions outside the molybdenum plates 5 are filled with a pressure transmitting medium. A cylindrical heater 4 is disposed around the synthesizing vessel for heating the synthesizing vessel.

In the synthesizing vessel shown in FIG. 2, the central portion in the axial direction of the vessel is heated to the highest temperature and the upper and lower ends of the vessel are heated to relatively low temperatures. BN dissolved in the solvent 3 from the BN source 2 under the ultra-high pressure and high temperature conditions for maintaining the cBN stable, is deposited as cBN on the seed crystal 1 having a relatively low temperature. This second method makes use of a difference in the solubility of BN in the solvent metal due to a temperature difference and is hence called a temperature difference method. Advantages of the temperature difference method are that cBN can be grown only from the seed crystal and that the growth rate can be controlled by maintaining a temperature difference at a prescribed value. According to the above described temperature difference method, it has been ascertained on a laboratory scale that large-sized cBN crystals of 0.5 ct. size can be synthesized.

For practicing this temperature difference or second method, an arrangement symmetrical with regard to a horizontal center line, including an upper chamber and a lower chamber having BN sources 2, solvents 3 and seed crystals 1 therein arranged as shown in FIG. 3, may be adopted for an effective utilization of the space in the synthesizing vessel. The arrangement in the synthesizing vessel has a temperature distribution symmetrical to the horizontal center line, as schematically shown on the right of FIG. 3. A high temperature prevails in the central portion of the vessel and the temperatures decrease toward the upper and lower ends of the vessel in the axial directions. However, as the result of conducting experiments by actually using such a synthesizing vessel, it has become clear that large-sized crystals of cBN of good quality can be synthesized in the lower chamber of the vessel, while crystals of good quality cannot be grown in the upper chamber of the vessel even if the temperature of the upper chamber section is maintained at the same level as the temperature of the lower chamber section and the same materials are used. The reasons for this difference are considered to be as follows. When hBN is dissolved in the solvent, the specific gravity of the solvent is decreased. The specific gravity also decreases as the temperature increases. In the lower chamber section of the vessel, solution of hBN in the solvent occurs at an upper end of the solvent and the temperature is raised higher in the upper end. On the other hand, a solution of hBN and an increase of the temperature in the upper chamber section of the vessel occur in a reversed manner. Thus, the lower end of the solvent in the upper chamber section of the vessel has the smallest specific gravity and convection occurs in the upper chamber section by the influence of gravity. As a result, BN is excessively supplied to the upper end portion where seed crystals are placed, which makes it impossible to control the growth rate for growing crystals of good quality.

For the above described reasons, cBN can be synthesized only in the lower chamber section of the synthesizing vessel by the conventional synthesizing method based on a temperature difference.

SUMMARY OF THE INVENTION

According to the technique of synthesizing cBN by the above described conventional temperature difference method, the space in the synthesizing vessel could not be effetively utilized as shown above.

Therefore, it is an object of the present invention to provide a method for efficiently synthesizing large-sized crystals of cBN of high quality.

The present invention is based on recognizing the following two points.

(1) A plurality of solvents having different eutectic temperatures with respect to hBN are used according to the respective temperatures in several synthesizing chambers and BN sources and seed crystals associated with the respective solvents are used. By selecting the solvents, the BN sources and the seed crystals in the above described manner, cBN can be synthesized in each of the appropriately divided chambers of the synthesizing vessel having a certain temperature distribution.

(2) The synthesizing vessel is heated with a specified temperature gradient. In combination with the method indicated in (1), each of the chambers is divided into multiple stages and each stage is heated to a temperature gradient in which one end portion of each chamber stage is heated to a relatively high temperature and the other end portion of each chamber stage is heated to a relatively low temperature. Thus, the whole space of the synthesizing vessel can be effectively utilized.

More specifically stated, the present invention is a method of synthesizing crystals of cubic system boron nitride by using boron nitride sources, solvents for dissolving the boron nitride sources and seed crystals under conditions of ultra-high pressure and high temperature at which cubic system boron nitride can be maintained in a stable condition. The present method uses a synthesizing vessel divided into two or more chambers separated by one or more partition layers not reacting with the solvents, the synthesizing vessel being constructed so that the two or more chambers are disposed to be heated to a temperature gradient in a specified direction. The just stated method of the present invention comprises the steps of: placing, in the two or more chambers, the above stated solvents having different eutectic temperatures with respect to the boron nitride sources according to the above stated temperature gradient; placing the boron nitride sources in contact with portions of the solvents heated to relatively higher temperatures for a high-temperature heat treatment; placing at least one seed crystal in a portion of each solvent heated at a relatively lower temperature at the time of said high-temperature heat treatment; and growing at least one cubic system boron nitride crystal in each of the solvents in the chambers by applying the heat treatment to the synthesizing vessel under conditions of ultra-high pressure and high temperature to make sure that the above stated temperature gradient is present in the synthesizing vessel.

These objects and other objects, features, aspects and advantages of the present invention will become more apparent from the following detailed description of the present invention when taken in conjunction with the accompanying drawings.

DESCRIPTION OF THE PREFERRED EMBODIMENTS AND OF THE BEST MODE OF THE INVENTION

Figure 1:
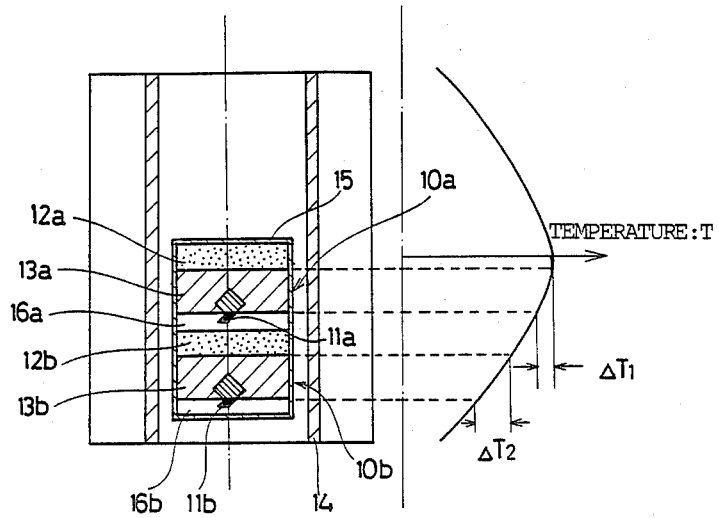
FIG. 1 is a sectional view showing a synthesizing vessel to be used for carrying out a synthesizing method of an embodiment of the present invention.
Figure 2:
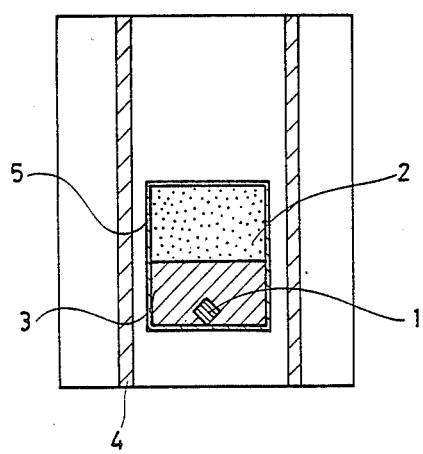
FIG. 2 is a sectional view showing a synthesizing vessel used in a conventional temperature difference method.
Figure 3:
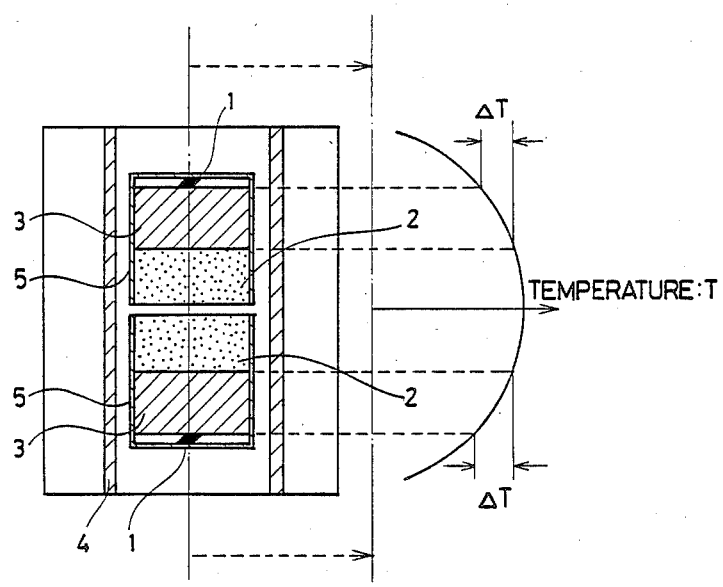
FIG. 3 is a sectional view showing a synthesizing vessel used in another conventional synthesizing method.

FIG. 1 is a sectional view showing an example of a synthesizing vessel for performing the present invention. The synthesizing vessel enclosed by a housing 15 of molybdenum disposed in a cylindrical heater 14. The synthesizing vessel is divided into two chambers 10$a$ and 10$b$. BN sources 12$a$ and 12$b$, solvents 13$a$ and 13$b$, and seed crystals 11$a$ and 11$b$ are placed in the chambers 10$a$ and 10$b$, respectively, in the same sequence or order in the axial direction from top to bottom. The seed crystals 11$a$ and 11$b$ are embedded in seed beds 16$a$ and 16$b$, respectively. The seed bed 16$a$ separates the chambers 10$a$ and 10$b$ and therefore it functions as a partition layer in this invention.

If the synthesizing vessel shown in FIG. 1 is heated by using a heater 14, a temperature gradient is obtained as shown on the right of FIG. 1. If cBN is synthesized in the synthesizing vessel shown in FIG. 1, there are caused temperature differences $\Delta T_1$ and $\Delta T_2$ in the seed crystals of the chambers 10$a$ and 10$b$, respectively, between the upper end portion and the lower end portion of the solvents 13$a$ and 13$b$. The temperature ranges of these chambers are different.

Figure 4:
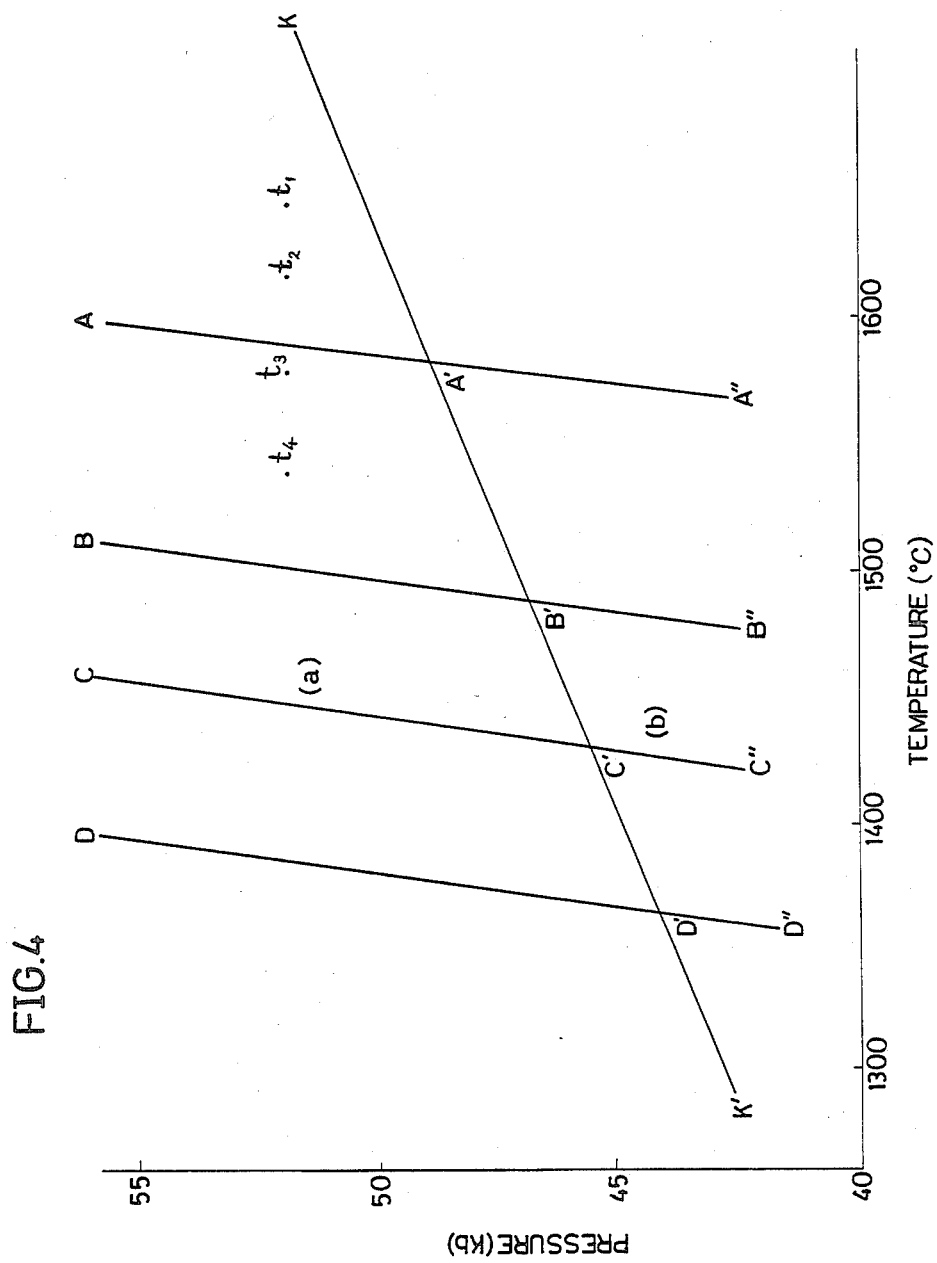
FIG. 4 is a pressure-temperature graph for explaining the principle of the present invention, showing pressure and temperature regions where crystals of cBN can be synthesized.

FIG. 4 shows an equilibrium line KK' between cBN and hBN and the change in eutectic temperatures of the utilized solvents with respect to hBN. A range where cBN can be synthesized is a pressure and temperature region defined by lines AA'K in case of using a solvent having a pressure dependent characteristic of its eutectic temperature as shown by the line AA" for example. Accordingly, it is assumed that the temperatures in the upper end portion and in the lower end portion of the solvent in each chamber in FIG. 1 are represented as $t_1$ and $t_2$ or $t_3$ and $t_4$, for example. In this case, if the solvent 13$a$ having an eutectic temperature on the line AA' is used in the upper chamber and the solvent 13$b$ having an eutective temperature on the line BB' lower than the temperature on the line AA' is used in the lower chamber, crystals of cBN can be synthesized in both of the chambers. However, if the solvent having the eutectic temperature on the line AA' is used in the lower chamber cBN cannot by synthesized.

Figure 5:
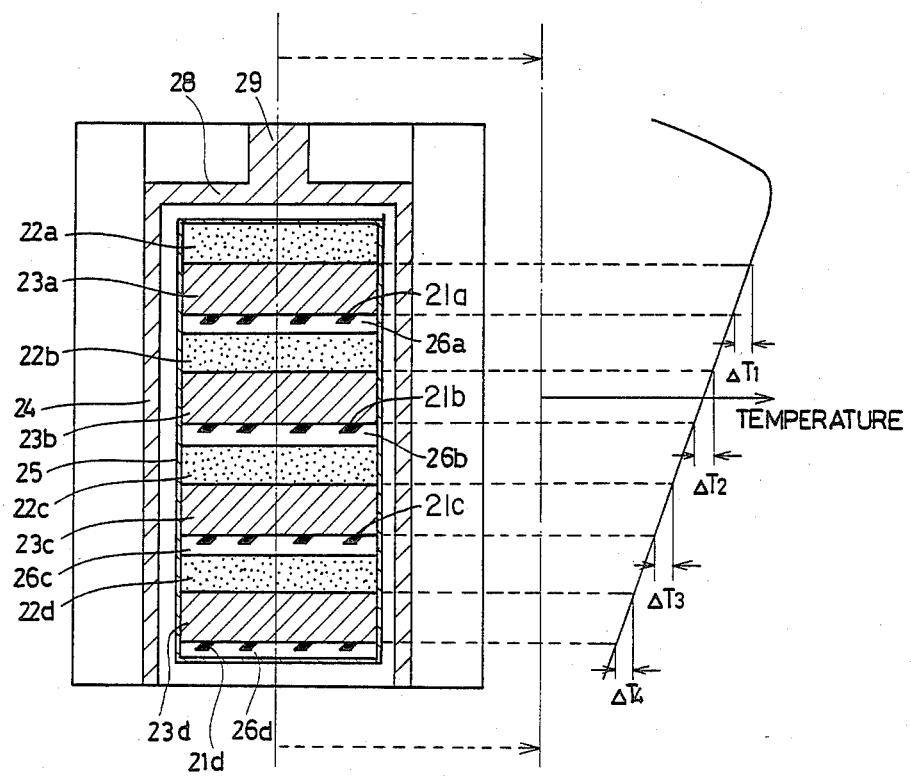
FIG. 5 is a sectional view showing another example of a synthesizing vessel used in an embodiment of the present invention, whereby the synthesizing vessel comprises four chambers.

FIG. 5 shows a further developed arrangement in a synthesizing vessel in accordance with the present invention. In this example, the whole body of the synthesizing vessel has a temperature gradient in a specified direction so that the temperature in the effectively utilizable synthesizing vessel can be decreased in the direction from a top portion of the vessel to a bottom portion thereof as shown in FIG. 5. In order to make the synthesizing vessel have such a temperature gradient, there are provided a disk-shaped heater 28 on the top portion of the cylindrical heater 24 and a heater 29 having small sectional area in contact with the heater 29. By this arrangement of the heaters, the upper portion of the synthesizing vessel can be more sufficiently heated as compared with the lower portion thereof so that the temperature gradient shown in FIG. 5 is achieved. The synthesizing vessel is divided into four chambers by partition members 26$a$, 26$b$, 26$c$, and 26$d$ which function as seed beds for seed crystals 21$a$, 21$b$, 21$c$, and 21$d$. Solvent layers 23$a$, 23$b$, 23$c$, and 23$d$ are placed on the respective seed beds. BN sources 22$a$, 22$b$, 22$c$, and 22$d$ are placed on the solvent layers 23$a$, 23$b$, 23$c$, and 23$d$, respectively. If the thicknesses of the seed beds 26$a$ to 26c functioning as the partition layers or the thicknesses of the solvents 23a to 23d are selected appropriately, crystals of cBN can be synthesized simultaneously in the four chambers of the vessel by using a temperature difference method and four kinds of solvents having different eutectic temperatures AA', BB', CC' and DD' as shown in FIG. 4 in the respective chambers. In this manner, the whole volume of the synthesizing vessel can be effectively utilized and a large number of large-sized crystals of cBN can be synthesized simultaneously. Particularly, if a synthesizing apparatus is constructed to form a large size synthesizing vessel, the conventional method can only utilize one chamber of the vessel whereby the proportion of useless space is merely increased and thus the conventional method is undesirable from an economical point of view. By contrast, a method of the present invention makes it possible to effectively utilize a large synthesizing vessel whereby cBN can be synthesized at a considerably reduced cost.

Although the plurality of divided chambers were arranged vertically in any synthesizing vessel shown in FIGS. 1 and 5, such vertical arrangement of chambers is not necessarily needed. For example, if a plurality of chambers are arranged radially in a synthesizing vessel so as to provide a temperature gradient in the radial direction, crystals of cBN can also be synthesized in the thus arranged chambers.

Solvents to be used in the present invention may be the same solvents as are used for the conventional method of synthesizing cBN. However, in order to obtain crystals of good quality having a high priority, it is preferable to use, as solvents, boric nitrides of alkaline metal or alkaline earth metal such as $Li_3BN_2$, $Mg_3B_2N_4$, $Ca_3B_2N_4$. These solvents have different eutectic temperatures with respect to hBN. Suitable solvents may be selected among those according to the temperature gradient of the synthesizing vessel.

Furthermore, a suitable additive may be added to one of the above stated boric nitrides of alkaline metal or alkaline earth metal, or two or more kinds of the above stated boric nitrides may be mixed at a suitable ratio, whereby an eutectic compound or the like is produced, causing change in the eutectic temperature with respect to hBN. By making use of this, a solvent having a desired eutectic temperature may be prepared so as to be used for application of the present invention.

It was ascertained by the experiments conducted by the inventors of the present invention that crystals of cBN of high quality can be obtained more preferably by using as the solvents a mixture of one or more borates of alkaline metal or alkaline earth metal, at least either $Li_3N$ or $Li_3BN_2$, and at least one of $Sr_3N_2$, $Ba_3N_2$, $Sr_3B_2N_4$ and $Ba_3B_2N_4$. It is most preferable to use a solvent containing at least either $Li_3N$ or $Li_3BN_2$ in 1 to 10 wt. %, and also containing in 5 to 30 wt. % at least one selected from the group consisting of $Sr_3N_2$, $Ba_3N_2$, $Sr_3B_2N_4$ and $Ba_3B_2N_4$, the remaining part being one or more borates of alkaline metal or alkaline earth metal, whereby large-sized crystals of cBN of high quality can be obtained.

In addition, for the purpose of preventing seed crystals from dissolving in the solvent, hBN of 0.5 to 1 mol % may be added to the above stated solvent, although the effect depends on the composition of the solvent. Particularly, this purpose can be attained effectively in case of adding the above indicated amount of hBN to a solvent only containing a boric nitride of an alkaline metal or an alkaline earth metal.

Instead of the above stated boric nitrides of alkaline metal or alkaline earth metal, alkaline metals or alkaline earth metals such as Li, Mg, Ca or Sr, or nitrides of an alkaline metal or an alkaline earth metal such as $Li_3N$, $Mg_3N_2$, $Ca_3N_2$ or $Sr_3N$ may be used as solvents. However, the quality and purity of cBN crystal obtained in these cases tend to be a little less compared to the case using boric nitrides.

Instead of the above stated solvents of the alkaline metal system or the alkaline earth metal system, solvents containing aluminum alloys such as Ni-Al alloy, Co-Al alloy, Mn-Al alloy, Fe-Al alloy and Si-Al alloy may be used. In these cases, the eutectic temperature with respect to hBN can be changed by changing the ratio of composition of such alloys. Consequently, a suitable ratio of an alloy composition can be determined according to the temperature gradient of the synthesizing vessel.

As the BN source in the present invention, cBN powder or hBN powder or a mixture of hBN powder and fine cBN powder or the like may be used. The seed crystals to be used are small grains of cBN.

The temperature difference in the solvent portions required for practicing the present invention, is in a range from 10° C. to 150° C. and preferably in a range from 20° C. to 70° C. If the temperature difference is small, the growth rate of cBN is slow and if the temperature difference is too large, crystals of good quality cannot be obtained.

As an apparatus to be used for synthesizing cBN in accordance with the present invention, a belt-type apparatus or a girdle-type apparatus is preferred. However, other ultra-high pressure applying apparatus such as a hexahedron anvil apparatus or an apparatus using a piston and a leader may be used. Pressure and temperature conditions for synthesizing cBN according to the present invention differ depending on the solvent to be used. In order to synthesize cBN crystals of good quality, the temperature in the low-temperature portion of the solvent suited for growth of cBN is required to be 125° C. or more and the pressure in that portion needs to be 40 Kb or more.

Figure 6A:
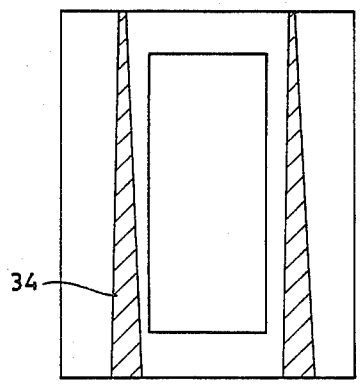
FIG. 6A is a sectional view for explaining an example of a heater used for heating a synthesizing vessel for carrying out the method of the present invention.
Figure 6B:
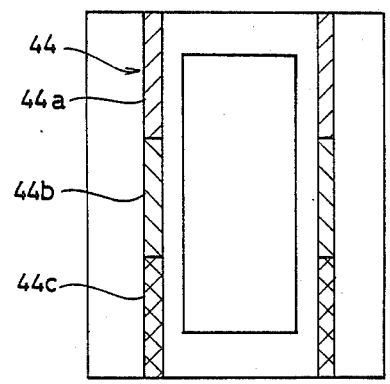
FIG. 6B is a sectional view showing another example of a heater used for heating a synthesizing vessel for carrying out the method of the present invention.

In order to assure that the synthesizing vessel of the present invention has a temperature gradient in a specified direction, various methods may be adopted. Instead of the use of the structure of the heater shown in FIG. 1 and FIG. 5, a method of changing the sectional shape of the heater 34 as shown in FIG. 6A to increase the temperature in an upper portion, or a method of using different materials for the cylindrical heater 44 divided into multiple portions as shown in FIG. 6B to decrease the specific resistance values of the divided portions 44a, 44b and 44c successively from the upper portion to the lower portion, or a method of combining those methods may be used.

When the temperature of the solvent portion at the time of synthesizing cBN is increased and the solvent in a portion contacting the seed crystals begins to dissolve, it may happen that seed crystals dissolve and dissappear in the solvent. In such a case, nucleation of cBN occurs spontaneously during synthesization and the desired large-sized single crystals of cBN cannot be obtained.

This problem can be solved by dissolving BN in advance in the solvent. BN in the solvent is preferably in a saturated state and thus cBN single crystals of high quality can be obtained.

Alternatively, the solvent and hBN may be mixed to be in a nearly saturated state and in this case, the same effect as described above can also be obtained.

In the following, the present invention will be more specifically described in connection with examples.

EXAMPLE 1

The structure of a synthesizing vessel as shown in FIG. 1 was used.

As the solvents 13a and 13b, a pressed disk of $Ca_3B_2N_4$ was used in the upper chamber and a pressed disk of $Ba_3B_3N_4$ was used in the lower chamber. Each of the pressed disks of the solvents had a diameter of 12 mm and a thickness of 5 mm. As the BN sources 12a and 12b, pressed disks each containing a mixture of cBN powder and hBN powder at a ratio of 1:1 by weight were used. Crystals of cBN having a diameter of about 0.7 mm were used as the seed crystals 1 and they were placed on platinum seed beds 16a and 16b so as to be in contact with the bottom surface of the solvent in each chamber. The number of seed crystals was three in each chamber but only one seed crystal is shown in each chamber of FIG. 1. Pyrophyllite was used as a pressure transmitting medium around the outer wall of the graphite heater 14, while a molded hBN was placed as a pressure transmitting medium within the graphite heater 14. The molybdenum housing 15 separates the BN sources and the solvents from the molded hBN.

A girdle-type ultra-high pressure generating apparatus was used and the heater 14 was under a pressure of 52 Kb while heating the synthesizing vessel so that the upper surface of the solvent in the upper chamber was heated to a temperature of 1450° C. At that time, it was supposed that the temperature of the lower surface of the solvent in the upper chamber was about 1400° and the temperatures of the upper surface and the lower surface of the solvent in the second chamber were 1380° C. and 1300° C., respectively. The heated state was maintained for 30 hours and then the contents were taken out. Thus, three cBN crystals of about 0.05 ct. were obtained in the upper chamber and three cBN crystals of 0.15 ct. were grown in the lower chamber.

EXAMPLE 2

The structure of a synthesizing vessel as shown in FIG. 5 was used.

The disks of solvents 23a to 23d in the respective chambers each had a diameter of 25 mm and a thickness of 6 mm. A pressed disk of $Li_3BN_2$ was used as the solvent in the uppermost chamber; a pressed disk of a mixture of $Li_3BN_2$ and $Ca_3B_2N_4$ at a ratio of 10:3 was used as the solvent in the second chamber; a pressed disk of $Sr_3B_2N_4$ was used in the third chamber; and a pressed disk of $Ba_3B_2N_4$ was used as the solvent in the lowermost fourth chamber. The BN sources 22a to 22d were pressed disks of the same kind as in the Example 1. Seven cBN seed crystals having a diameter of about 0.7 mm were placed on a platinum seed bed in each chamber in the same manner as in the Example 1. Pyrophyllite was used as a pressure transmitting medium around the outer wall of the graphite heater 24 and a shaped body of hBN was put as a pressure transmitting medium between the graphite heater 24 and a housing of Mo plates 25 to separate the BN sources 22a to 22d and the solvents 23d to 23d from the shaped body of hBN.

A girdle-type ultra-high pressure generating apparatus was used and the heater was under a pressure of 55 Kb while heating the synthesizing vessel so that the temperature of the bottom surface of the $Li_3BN_2$ solent in the uppermost chamber was about 1620° C. At the same time, the temperature of the bottom surface of the $Ba_3B_2N_4$ solvent in the lowermost fourth chamber was about 1270° C. That state was maintained for 60 hours and then the contents of the vessel were taken out. cBN cystals of about 0.25 ct. were grown from the seed crystals in each chamber and thus 1.7 ct. were obtained in each chamber.

EXAMPLE 3

The synthesizing vessel had the same structure as in the Example 2, except that the solvents used were 50Ni-50Al alloy, 60Ni-40Al alloy, 60Ni-35Al alloy and 70Ni-30Al alloy in the first to fourth chambers, respectively, in the order starting from the uppermost chamber downwardly.

Pressure of 55 Kb was applied and the vessel was heated so that the temperature of the bottom surface of the 50Ni-50Al alloy solvent in the uppermost chamber was 1650° C. At the same time, the temperature of the bottom surface of the 70Ni-30Al alloy solvent in the fourth chamber was about 1300° C. That state was maintained for 60 hours and then the contents of the vessel were taken out. cBN crystals of 0.15 to 0.25 ct. were grown from the seed crystals in each of the four chamber of the vessel.

In the following, preferred examples using preferred solvents out of the aboved described solvents will be more specifically described.

EXAMPLE 4

A synthesizing vessel having the same structure as shown in FIG. 1 was used. The solvents 13a and 13b comprised a pressed disk of $3Li_3N\text{-}10Sr_3N_2\text{-}87Sr_3B_2O_6$ and a pressed disk of $3Li_3N\text{-}10Ba_3N_2\text{-}87Ba_3B_2O_6$ disposed in the upper chamber 10a and in the lower chamber 10b, respectively. Each of the pressed disks of the solvents 13a and 13b had a diameter of 12 mm and a thickness of 5 mm. Pressed disks of a mixture of cBN powder and hBN powder at a ratio of 1:1 by weight were used for the BN sources 12a and 12b. The seed crystals 11a and 11b of cBN had a diameter of about 0.7 mm and they were placed in contact with the bottom surfaces of the solvents 13a and 13b in the chambers 10a and 10b, by using platinum seed beds 16a and 16b, respectively. Each seed bed 16a and 16b carried three seed crystals 11a and 11b. Pyrophyllite was provided as a pressure transmitting medium around the outer wall of the graphite heater 14 and a shaped body of hBN was put within the graphite heater 14. A housing of molybdenum plates 15 separated the BN sources 12a and 12b and the solvents 13a and 13b from the shaped body of hBN.

A girdle-type ultra-high pressure generating apparatus was used and the heater 14 was under a pressure of 52 Kb while heating the synthesizing vessel so that the upper surface of the solvent 13a in the upper chamber 10a was heated to a temperature of 1650° C. At the same time, the temperature of the lower surface of the solvent 13a was about 1600° C. It was supposed that the temperatures of the upper surface and the lower surface of the solvent 13b in the lower chamber 10b were 1570° C. and 1500° C., respectively. The heated state was maintained for 30 hours and then the cBN crystals obtained were taken out. Thus, it was found that three cBN crystals of about 0.1 ct. were grown in the upper chamber 10a and three cBN crystals of about 0.1 ct. were grown in the lower chamber 10b.

EXAMPLE 5

Crystals of cBN were grown by using the same synthesizing vessel as in the Example 4. The difference compared to Example 4 is that $8Li_3BN_2\text{-}15Sr_3B_2N_4\text{-}77Sr_3B_2O_6$ was used as the solvent 13a in the upper chamber 10a, and $8Li_3BN_2\text{-}20Ba_3B_2N_4\text{-}72Ba_3B_2O_6$ was used as the solvent 13b in the lower chamber 10b. The other materials were the same as in Example 4.

The synthesizing vessel constructed as described above was heated by the heater 14 under pressure of 52 Kb using a girdle-type ultra-high pressure generating apparatus so that the upper surface of the solvent 13a in the upper chamber 10a was at a temperature of 1650° C. At the same time, it was supposed that the temperature of the lower surface of the solvent 13a was about 1600° C. and the temperatures of the upper surface and the lower surface of the solvent 13b in the lower chamber 10b were 1570° C. and 1500° C., respectively. The heated state was maintained for 30 hours and then the grown cBN crystals were taken out. As a result, it was found that three cBN crystals of about 0.15 ct. were grown in the upper chamber 10a and three cBN crystals of 0.2 ct. were grown in the lower chamber 10b.

EXAMPLE 6

A synthesizing vessel having the same construction as in the Example 2 was used and $5Li_3N\text{-}15Sr_3B_2N_4\text{-}79Sr_3B_2O_6\text{-}1hBN$, $5Li_3N\text{-}15Sr_3B_2N_4\text{-}70Sr_3B_2O_6\text{-}9K_2B_4O_7\text{-}1hBN$, $3Li_3N\text{-}20Ba_3B_2N_4\text{-}65Ba_3B_2O_6\text{-}11K_2B_4O_7\text{-}1hBN$ and $3Li_3N\text{-}20Ba_3B_2N_4\text{-}59Ba_3B_2O_6\text{-}17Na_2B_4O_7\text{-}1hBN$ were used as the solvents in this order from the upper most chamber to the lowermost chamber.

Pressure of 55 Kb was applied and the synthesizing vessel was heated so that the bottom surface of the solvent 23a of $5Li_3N\text{-}15Sr_3B_2N_4\text{-}79Sr_3B_2O_6\text{-}1hBN$ in the uppermost chamber was heated to a temperature of 1700° C. At that time, the temperature of the bottom surface of the solvent 23d of $3Li_3N\text{-}20Ba_3B_2N_4\text{-}59Ba_3B_2O_6\text{-}17Na_2B_4O_7\text{-}1hBN$ in the lowermost chamber was about 1370° C. The heated state was maintained for 90 hours and then the grown crystals were taken out. As a result, it was found that cBN crystals of 0.5 to 0.6 ct. were grown from the seed crystals in each of the four chambers 20a to 20d.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for synthetically growing cubic system boron nitride crystals by using boron nitride sources, solvents for dissolving said boron nitride sources, and seed crystals under conditions of ultra-high pressure and high temperature for maintaining said cubic system boron nitride stable, said method comprising the following steps: preparing a synthesizing vessel having at least two chambers separated by one or more partition layers not reacting with said solvents, said at least two chambers being arrayed in order in said synthesizing vessel so as to be heated according to a temperature gradient; placing, in said at least two chambers, said solvents having different eutectic temperatures in each chamber with respect to said boron nitride sources according to said temperature gradient; placing said boron nitride source in contact with a portion of each of said solvents heated at a relatively higher temperature and placing at least a seed crystal in a portion of each of said solvents heated at a relatively lower temperature; and growing at least one cubic system boron nitride crystal in each of said solvents in said chambers by heating said synthesizing vessel for establishing said temperature gradient while maintaining conditions of ultra-high pressure and high temperature.

2. The method of synthesizing cubic system boron nitride crystals as defined in claim 1, wherein said temperature gradient is applied so that temperature is increased from one end of an array of said chambers to the other end of said array.

3. The method of synthesizing cubic system boron nitride crystals as defined in claim 1, wherein said chambers are arrayed in a radial direction and said temperature gradient is applied in said radial direction.

4. The method of synthesizing cubic system boron nitride crystals as defined in claim 2, wherein said chambers are arrayed in a vertical direction and said temperature gradient is applied to said chambers in said vertical direction.

5. The method of synthesizing cubic system boron nitride crystals as defined in claim 1, wherein a heater is provided around an outer wall of said synthesizing vessel so that said synthesizing vessel is heated for maintaining said temperature gradient.

6. The method of synthesizing cubic system boron nitride crystals as defined in claim 1, wherein a pressure of 40 Kb or more is applied for growing said cubic system boron nitride crystals, and wherein the lowest temperature applied to a portion of said solvent in the chamber heated to the lowest temperature compared to all other chambers of said synthesizing vessel, is 1000° C. or more.

7. The method of synthesizing cubic system boron nitride crystals as defined in claim 1, comprising selecting as said solvents a mixture containing at least one borate of an alkaline metal or alkaline earth metal, at least either $Li_3N$ or $Li_3BN_2$ and at least one of $Sr_3N_2$, $Ba_3N_2$, $Sr_3B_2N_4$ and $Ba_3B_2N_4$.

8. The method of synthesizing cubic system boron nitride crystals as defined in claim 7, selecting as said solvent a solvent containing at least either $Li_3N$ or $LI_3BN_2$ in 1 to 10 wt. %, at least one selected from the group consisting of $Sr_3N_2$, $Ba_3N_2$, $Sr_3B_2N_4$ and $Ba_3B_2N_4$, in 5 to 30 wt. % and at least one borate of an alkaline metal or alkaline earth metal as the remaining part.

* * * * *